US008508499B2

(12) United States Patent
Liang

(10) Patent No.: US 8,508,499 B2
(45) Date of Patent: Aug. 13, 2013

(54) TOUCH SENSING CIRCUITS AND METHODS FOR DETECTING TOUCH EVENTS

(75) Inventor: Ming-Jen Liang, Taoyuan Hsien (TW)

(73) Assignee: Delta Electronics, Inc., Taoyuan Hsien (TW)

( * ) Notice: Subject to any disclaimer, the term of this patent is extended or adjusted under 35 U.S.C. 154(b) by 539 days.

(21) Appl. No.: 12/813,897

(22) Filed: Jun. 11, 2010

(65) Prior Publication Data

US 2011/0155477 A1   Jun. 30, 2011

(30) Foreign Application Priority Data

Dec. 30, 2009  (TW) ................................ 98145743 A

(51) Int. Cl.
G06F 3/045     (2006.01)
G06F 3/044     (2006.01)

(52) U.S. Cl.
USPC ........................................ 345/174; 178/18.06

(58) Field of Classification Search
USPC ........................................ 345/174; 178/18.06
See application file for complete search history.

(56) References Cited

U.S. PATENT DOCUMENTS

| 4,561,002 | A | * | 12/1985 | Chiu | 341/33 |
| 5,465,091 | A | * | 11/1995 | Nishino et al. | 341/33 |
| 6,583,676 | B2 | * | 6/2003 | Krah et al. | 345/174 |
| 2002/0196066 | A1 | * | 12/2002 | Krah et al. | 327/291 |
| 2006/0016800 | A1 | * | 1/2006 | Paradiso et al. | 219/497 |
| 2006/0158041 | A1 | * | 7/2006 | Caldwell et al. | 307/116 |
| 2007/0159184 | A1 | * | 7/2007 | Reynolds et al. | 324/662 |
| 2008/0251299 | A1 | * | 10/2008 | Liao et al. | 178/18.06 |
| 2009/0256815 | A1 | * | 10/2009 | Westerinen et al. | 345/174 |

* cited by examiner

Primary Examiner — Adam J Snyder
(74) Attorney, Agent, or Firm — Muncy, Geissler, Olds & Lowe, PLLC

(57) ABSTRACT

A touch sensing circuit is provided. Signal generators output a pulse signal according to a control signal. Touch detection circuits are arranged as an array, generating a sensing signal according a touch event and the pulse signal. The touch detection circuits in the same row are coupled to the same signal generator. The sensing circuits are respectively coupled to the touch detection circuits in the same column, generating an output signal according to the sensing signal. The controller receives the output signal, outputs the control signal to control one of the signal generators outputting the pulse signal, and detects the touch detection circuit corresponding to the touch event according to the output control signal and the output signal.

18 Claims, 7 Drawing Sheets

TOUCH SENSING CIRCUITS AND METHODS FOR DETECTING TOUCH EVENTS

BACKGROUND OF THE INVENTION

1. Field of the Invention

The invention relates to touch sensing circuits, and in particular relates to touch sensing circuits for household products.

2. Description of the Related Art

Users usually operate electric equipment using man-machine interfaces (MMI). Generally, the man-machine interface comprises an input area and an output area. The input area is operated, such as turning on or off the electric equipment, according to a user's action. The turning on or off of the electric equipment by the man-machine interface can be achieved using mechanical or electrical means. A reliable control method identifies a touch event to control the electric equipment, avoiding operation error due to the aging of mechanical switches or objects interfering with photo-interrupt switches.

Conventional touch sensing circuits detect a touch event of a user using touch detection circuits, identify the electrical behavior of the circuit affected by the touch event by sensing circuits, and determine a location of the touch event, wherein a controller is used to perform corresponding operations.

However, the disadvantages of the conventional touch sensing circuits are circuit complexity and amount limitations dependent upon the number of input pins of a controller.

Thus, as man-machine interface product functions increases, for the issues of cost, there is a need for a touch sensing circuit with a simplified circuitry design and a high number of touch detection circuits.

BRIEF SUMMARY OF THE INVENTION

Touch sensing circuits and methods are provided. An exemplary embodiment of a touch sensing circuit comprises: a plurality of signal generators outputting a pulse signal according to a control signal; a plurality of touch detection circuits arranged as an array, generating a sensing signal according to a touch event and the pulse signal, wherein the touch detection circuits on the same row are coupled to the same signal generator; a plurality of sensing circuits respectively coupled to the touch detection circuits on the same column, generating an output signal according to the sensing signal; and a controller receiving the output signal, outputting the control signal to enable one of the signal generators outputting the pulse signal, and detecting the touch detection circuit corresponding to the touch event according to the output control signal and the output signal.

Another exemplary embodiment of a touch sensing circuit comprises: a plurality of signal generators outputting a pulse signal according to a control signal; a plurality of sensing circuits generating an output signal according to a sensing signal; a plurality of first data lines extended along a first direction, and respectively coupled to a corresponding signal generator; a plurality of second data lines extended along a second direction orthogonal to the first direction, and respectively coupled to a corresponding sensing circuit; a plurality of touch detection circuits respectively disposed on intersections of the first data lines and the second data lines, wherein one of the touch detection circuits receives the pulse signal and generates the sensing signal according to a touch event; and a controller receiving the output signal, outputting the control signal to enable one of the signal generators outputting the pulse signal, and detecting the touch detection circuit corresponding to the touch event according to the output control signal and the output signal.

Another exemplary embodiment of a touch sensing circuit comprises: a signal generator outputting a pulse signal according to a control signal; and a touch detection circuit generating a sensing signal according to a touch event. The pulse signal comprises a first capacitor coupled to the signal generator, a second capacitor coupled to the first capacitor, a first diode having a first anode coupled to the second capacitor, and a first cathode outputting the sensing signal. A second diode has a second anode coupled to a reference power source, and a second cathode coupled to a connection point of the first diode and the second capacitor. A first resistor is coupled between the reference power source and a connection point of the first capacitor and the second capacitor, and a touch sensing device is coupled to the connection point of the first capacitor and the second capacitor, and provides a loading effect according to the touch event. A sensing circuit is coupled to the touch detection circuit, and generates an output signal according to the sensing signal, and a controller outputs the control signal and detects the touch event according to the output signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
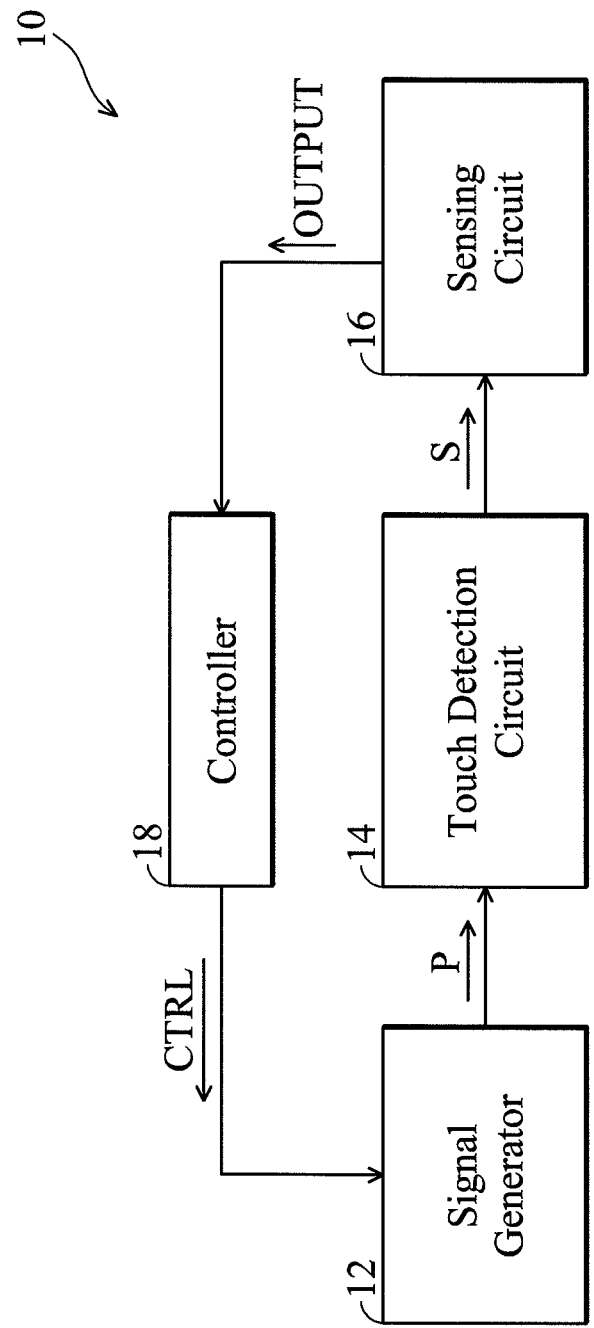
FIG. 1 shows a touch sensing circuit according to an embodiment of the invention.

FIG. 1 shows a touch sensing circuit according to an embodiment of the invention. The touch sensing circuit 10 comprises a signal generator 12, a touch detection circuit 14, a sensing circuit 16 and a controller 18. The signal generator 12 generates a pulse signal P according to the control signal CTRL. According to an embodiment of the invention, the pulse signal P can be a pulse width modulation (PWM) signal, and the control signal CTRL is provided by the controller 18 to control the operation of the signal generator 12. The touch detection circuit 14 generates a sensing signal S according to a touch event and the pulse signal P. The sensing circuit 16 generates an output signal OUTPUT according to the sensing signal S. The controller 18 detects the touch event according to the output signal OUTPUT, and outputs the control signal CTRL to control the operation of the signal generator 12.

Figure 2:
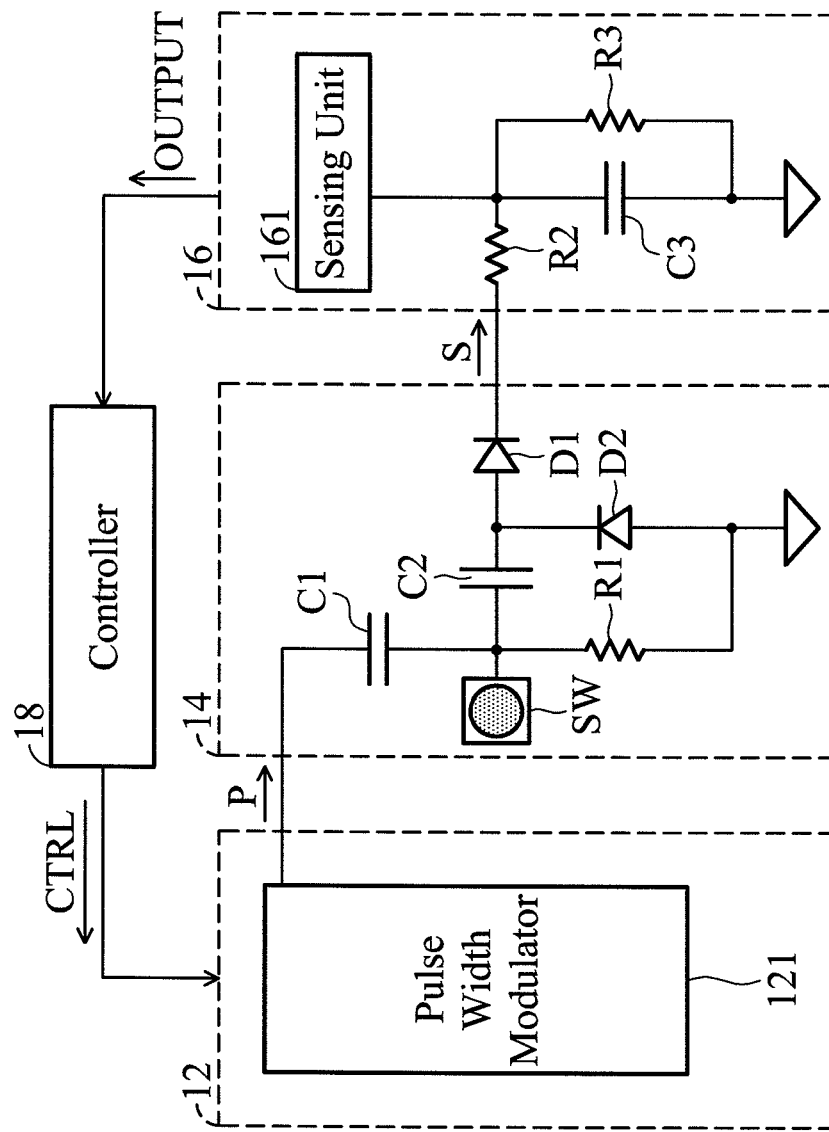
FIG. 2 is a circuit diagram showing a touch sensing circuit according to an embodiment of the invention.

FIG. 2 is a circuit diagram showing a touch sensing circuit according to an embodiment of the invention. In an embodiment of the invention, the signal generator 12 may comprise a pulse width modulator 121, which is enabled to output the pulse signal P in response to the control signal CTRL. According to an embodiment of the invention, the pulse signal P can be incessant square waves in a range of 400 KHz~1 MHz.

The touch detection circuit 14 comprises capacitors C1 and C2, diodes D1 and D2, a resistor R1 and a touch sensing device SW. The capacitor C1 is coupled to the signal generator 12, and the capacitor C2 is coupled to the capacitor C1. The diode D1 is coupled between the capacitor C2 and the sensing circuit 16, wherein an anode of the diode D1 is coupled to the capacitor C2, and a cathode of the diode D1 is coupled to the sensing circuit 16. The diode D2 is coupled between a connection point of the diode D1 and the capacitor C2 and a reference voltage (ground voltage as an example), wherein an anode of the diode D2 is coupled to the ground voltage and a cathode of the diode D2 is coupled to a connection point of the diode D1 and the capacitor C2. The resistor R1 is coupled between a connection point of the capacitors C1 and C2 and a reference voltage (ground voltage as an example). The touch sensing device SW is coupled to the connection point of the capacitors C1 and C2.

Figure 3:
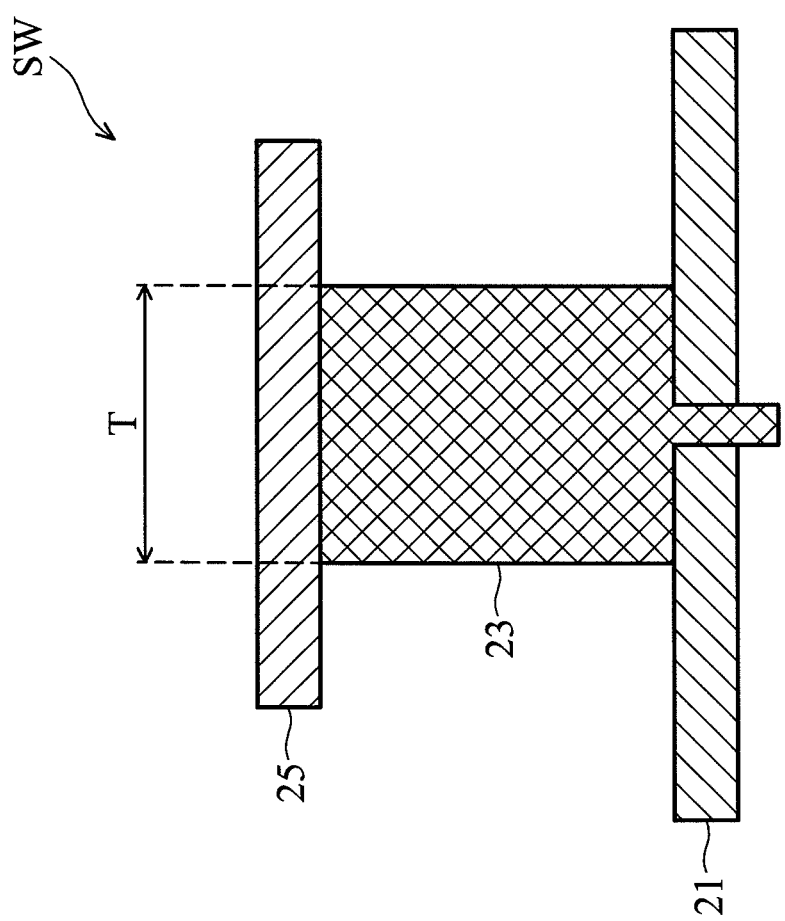
FIG. 3 is a cross-sectional diagram of the touch sensing device according to an embodiment of the invention.

FIG. 3 is a cross-sectional diagram of the touch sensing device SW according to an embodiment of the invention. The touch sensing device SW comprises a conductive portion 23 located on a circuit board 21 and a non-conductive portion 25 located on the conductive portion 23. The non-conductive portion 25 comprises a sensing region T on the surface opposite to the conductive portion 23. In an embodiment of the invention, the materials of the non-conductive portion 25 can be glass, acrylics, or plastics, and the materials of the conductive portion 23 can be a sheet iron or sheet copper. When a conductive human body part such as a finger touches the sensing region T, a capacitive effect is generated by the human body part, the non-conductive portion 25, and the conductive portion 23, which provides a capacitive loading effect between a connection point of the capacitors C1 and C2 and a ground in the touch detection circuit 14.

Referring FIG. 2, the sensing circuit 16 comprises a resistor R2, a resistor-capacitor circuit formed by the resistor R3 and the capacitor C3 connected in parallel, and a sensing unit 161. The resistor R2 is coupled to a connection point of the diodes D1 and D2 of the touch detection circuit 14, and receives a sensing signal S. The sensing circuit 16 receives the sensing signal S through the resistor R2, detects a voltage level of the connection point of the resistors R2 and R3 and the capacitor C3 by the sensing unit 161 through the resistor-capacitor circuit formed by the resistor R3 and the capacitor C3, and outputs a corresponding DC (direct current) output signal OUTPUT. The controller 18 comprises an analog to digital converter converting the DC output signal OUTPUT to digital data to obtain a voltage corresponding to the DC output signal OUTPUT.

Before a human body part touches the touch sensing device SW, the pulse signal P having high frequency square waves provided by the signal generator 12 continuously charges and discharges the capacitors C1 and C2 of the touch detection circuit 14, and a sensing signal S is generated after regulation by the diodes D1 and D2, and is converted by the sensing circuit 16 to generate the output signal OUTPUT having a DC voltage level. When a human body part touches the touch sensing device SW, the generated induction capacitor changes the total equivalent capacitance of the touch detection circuit 14, wherein the total equivalent capacitance when a human body part touches the touch sensing device SW is 5-60% of that when a human body part does not touch the touch sensing device SW. Thus, the speed for charging or discharging is increased such that the voltage level of the sensing signal S is decreased. In addition, since the sensing signal S is decreased, the output signal OUTPUT generated by the sensing circuit 16 is also decreased. The voltage-decreased output signal OUTPUT is determined by the analog to digital converter of the controller 18 to identify that a user is touching the sensing region T.

Figure 4:
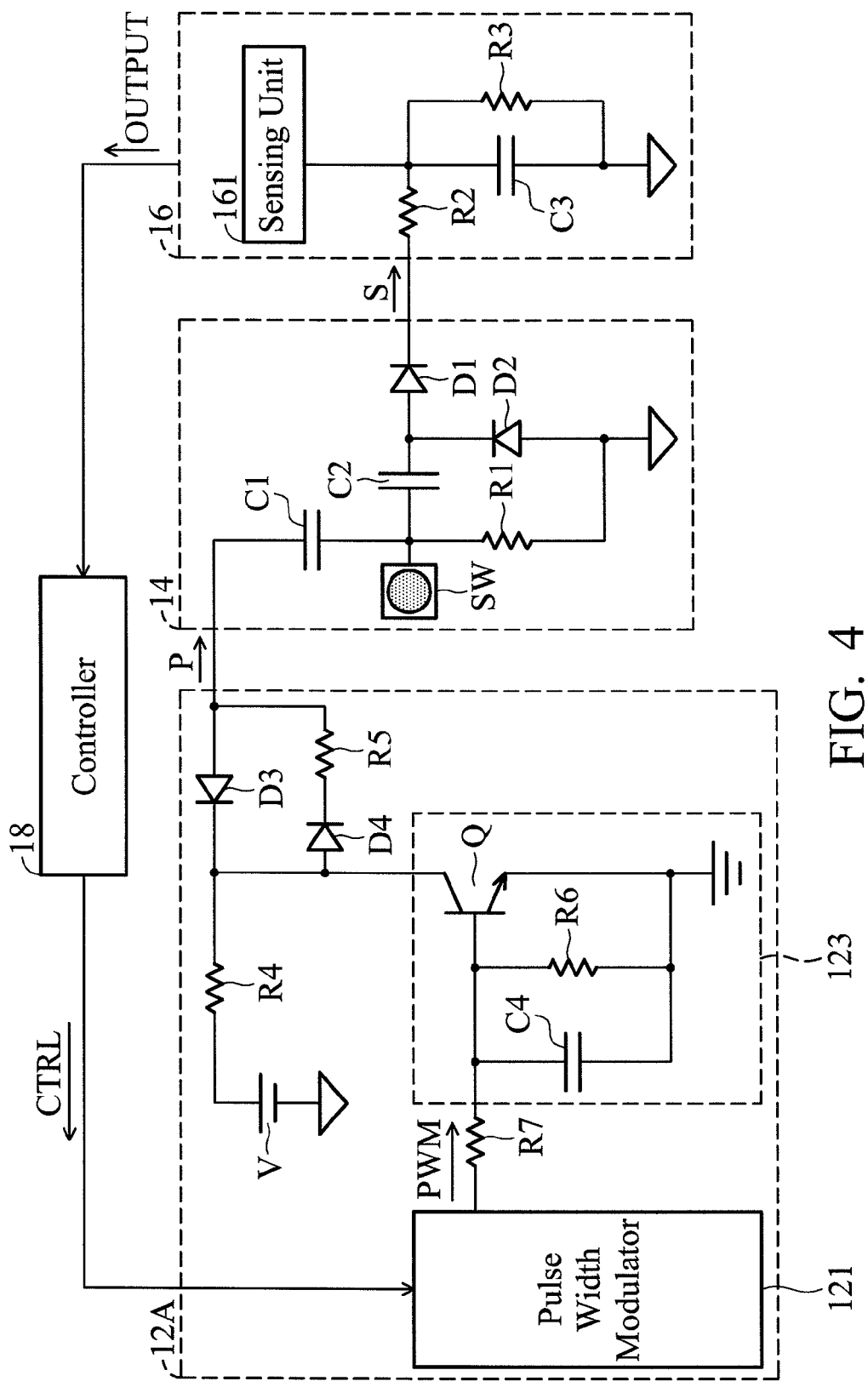
FIG. 4 is a circuit diagram showing a touch sensing circuit according to another embodiment of the invention.

In addition, the maximum detection voltage of the analog to digital converter of the controller 18 is limited by its reference input voltage. Thus, another embodiment of the invention adjusts the voltage range of the pulse signal P to adapt to the characteristics of the analog to digital converter of the controller 18. FIG. 4 is a circuit diagram showing a touch sensing circuit according to another embodiment of the invention. Unlike FIG. 2, the touch sensing circuit shown in FIG. 4 controls the voltage range of the pulse signal P output from the signal generator 12A. As shown, the signal generator 12A comprises a pulse width modulator 121, a switching circuit 123, a DC power source V, diodes D3 and D4, and resistors R4, R5, R6 and R7. The pulse width modulator 121 outputs the pulse width modulation signal PWM. The DC power source V provides a DC voltage. The anode of the diode D3 is coupled to the touch detection circuit 14, and the cathode of the diode D3 is coupled to the DC power source V through the resistor R4. The anode of the diode D4 is also coupled to the DC power source V through the resistor R4, and the cathode of the diode D4 is coupled to the touch detection circuit 14 through the resistor R5. The switching circuit 123 comprises a transistor Q and a resistor-capacitor circuit formed by the resistor R6 and the capacitor C4 connected in parallel. The transistor Q can be a bipolar transistor or a field-effect transistor (FET). Using a bipolar transistor as an example, the base of the transistor Q is coupled to the pulse width modulator 121 through the resistor R7, the emitter of the transistor Q is coupled to the ground, and the collector of the transistor Q is coupled to a connection point of the diodes D3 and D4. In addition, the resistor-capacitor circuit formed by the resistor R6 and the capacitor C4 is coupled between the base of the transistor Q and the ground.

According to the circuitry of the signal generator 12A shown in FIG. 4, since the current of the pulse width modulation signal PWM output from the pulse width modulator 121 is limited by the resistor R7, and the voltage level of the control gate of the transistor Q is stabilized by the capacitor C4 and the resistor R6, the pulse width modulation signal PWM provided to the transistor Q through the resistor R7 is able to switch the transistor Q. Thus, the connection point of the anode of the diode D3 and the cathode of the diode D4 generates the pulse signal P having high frequency square waves. In addition, the DC level of the pulse signal P is controlled by adjusting the DC power source V and the voltage drop of the diode, causing the voltage level detected by the controller 18 to be within an acceptable range.

Figure 5:
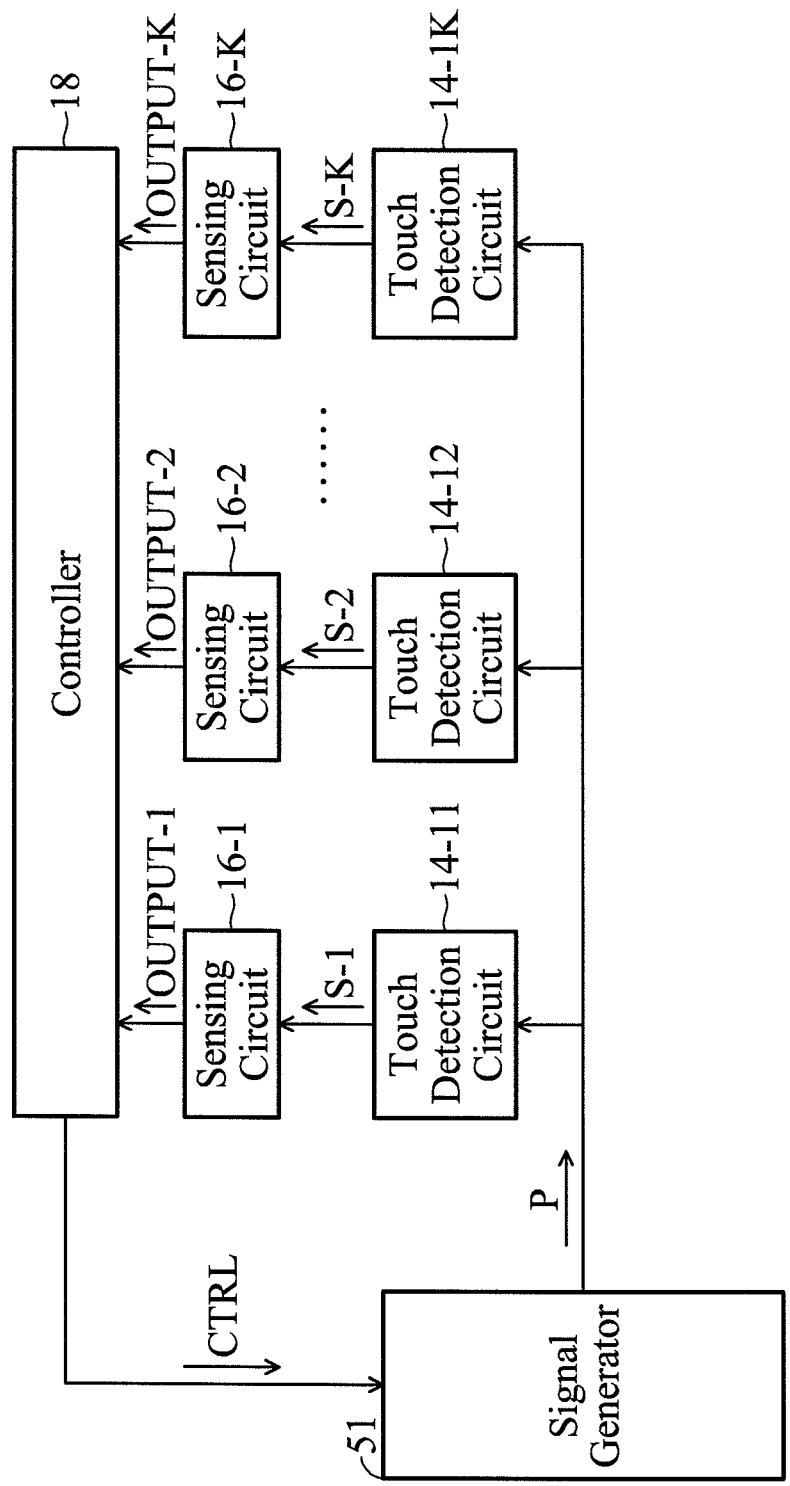
FIG. 5 is a circuit diagram showing a touch sensing circuit according to another embodiment of the invention.

FIG. 5 is a circuit diagram showing a touch sensing circuit according to another embodiment of the invention. It is noted that for implementing the signal generator 51 in FIG. 5, reference may be made to the signal generator 12 in FIG. 2 or the signal generator 12A in FIG. 4, and for implementing the touch detection circuits 14-11~14-1K and the sensing circuits 16-1~16-K, reference may be made, respectively, to the touch detection circuit 14 and the sensing circuit 16 in FIG. 2. Thus, detailed descriptions thereof are omitted here for the sake of brevity.

As shown, the pulse signal P output from a single signal generator 51 is provided to a plurality of touch detection circuits 14-11~14-1K simultaneously. Each touch detection circuits 14-11~14-1K respectively provides the sensing signals S-1~S-K to a corresponding sensing circuits 16-1~16-K, and each sensing circuits 16-1~16-K respectively outputs a corresponding output signal OUTPUT-1~OUTPUT-K according to the received sensing signal. Thus, the controller 18 determines which touch detection circuit is corresponding to the touch event according to the received output signal OUTPUT-1~OUTPUT-K, achieving the detection of the touch event using a plurality of touch detection circuits.

However, the number of the sensing circuits corresponding to the touch detection circuits is limited by the number of the input pins of the controller 18 (or the number of the input pins of the analog to digital converter).

Figure 6:
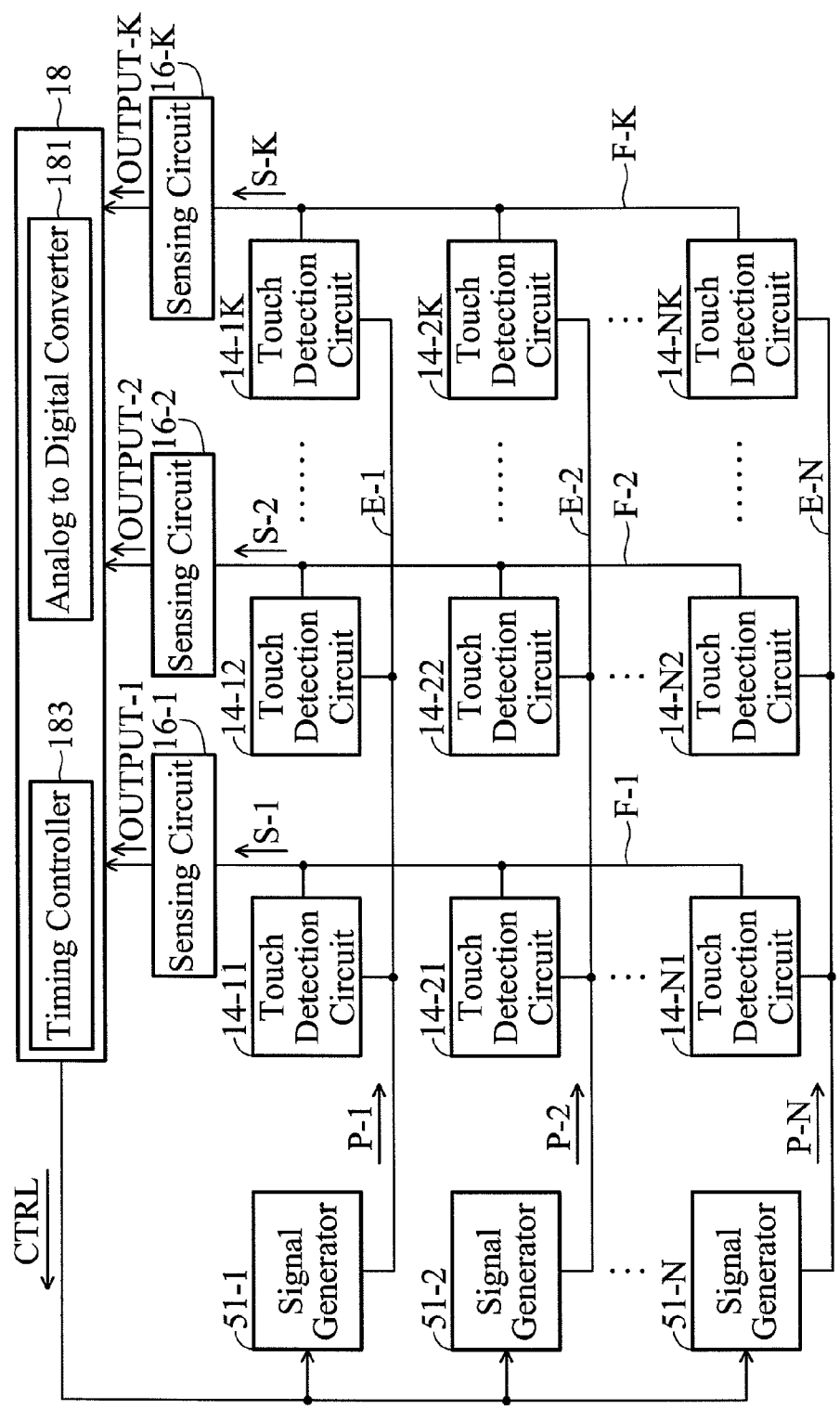
FIG. 6 is a circuit diagram showing a touch sensing circuit according to another embodiment of the invention.

FIG. 6 is a circuit diagram showing a touch sensing circuit according to another embodiment of the invention. In this embodiment, the touch detection circuits are arranged as an array. It is noted that for implementation of the signal generator 51-1~51-N in FIG. 6, which respectively outputs the pulse signals P-1~P-N, reference can be made to the signal generator 12 in FIG. 2 or the signal generator 12A in FIG. 4. Also, for implementation of the touch detection circuits 14-11~14-NK and the sensing circuits 16-1~16-K, reference can be respectively made to the touch detection circuit 14 and the sensing circuit 16 in FIG. 2. Thus, detailed descriptions thereof are omitted here for the sake of brevity. The data lines E-1~E-N are extended along a first direction, and are respectively coupled to a corresponding signal generators 51-1~51-N. The data lines F-1~F-K are extended along a second direction orthogonal to the first direction, and are respectively coupled to a corresponding sensing circuits 16-1~16-K. The touch detection circuits 14-11~14-NK are disposed at the intersections of the data lines E-1~E-N and F-1~F-K. According to the array-arrangement of the touch detection circuits shown in FIG. 6, the touch detection circuits on the same row are coupled to the same signal generator, and those on the same column are coupled to the same sensing circuit. For example, the touch detection circuits 14-21~14-2K on the same row are coupled to the signal generator 51-2, and the touch detection circuits 14-11~14-N1 on the same column are coupled to the sensing circuit 16-1.

In the touch sensing circuit shown in FIG. 6, the controller 18 comprises an analog to digital converter 181 and a timing controller 183. The analog to digital converter 181 converts the output signals OUTPUT-1~OUTPUT-K from a digital format to an analog format to obtain voltage levels of the output signals OUTPUT-1~OUTPUT-K. The timing controller 183 outputs the control signal CTRL to control the operation of the signal generators 51-1~51-N. The timing controller 183 controls the signal generators 51-1~51-N to make only one of the signal generators 51-1~51-N output the pulse signal. The pulse signals output by the signal generators can be in a sequence that is the same as that of the signal generators 51-1~51-N.

According to an embodiment of the invention, only one of the signal generators 51-1~51-N outputs the pulse signal in response to the control of the controller 18; while the others signal generators are disabled by the controller 18. The controller 18 identifies the touch event according to one of the output signals OUTPUT-1~OUTPUT-K received by the sensing circuit when the voltage detected by the sensing circuit is stable, disables the signal generator outputting the pulse signal after a predetermined time period, and then enables another signal generator to output the pulse signal. The voltage detection procedure is repeated until all the signal generators have output their pulse signals. Thus, the touch detection circuit corresponding to the touch event is identified, and peripheral functions are enabled according to the detection result for the man-machine interface.

According to an embodiment of the invention, the time period for stabilizing the voltage detected by the sensing circuit requires at least 10 microseconds. In addition, the controller can average the voltages detected by the sensing circuit (at least two samples) to obtain the effective value of the analog to digital converter, and the identified sensing region T is touched by the user according to the difference between the effective values. For example, as the controller 18 enables the signal generator 51-2 to output the pulse signal P-2 and detects that the voltage level of the output signal OUTPUT-1 output from the sensing circuit 16-1 has changed, it can be recognized that the touch event has occurred at the location corresponding to the touch detection circuit 14-21.

In addition, if the controller 18 comprises K input pins respectively receiving the output signals OUTPUT-1~OUTPUT-K, and comprises N output pins outputting the control signal CTRL to control the signal generators 51-1~51-N, the touch sensing circuit is able to detect the touch event of N*K touch detection circuits. Compared with the controller detecting the touch event of K touch detection circuits of the embodiment shown in FIG. 5, the embodiment shown in FIG. 6 has more detection points. In other words, a controller chip with fewer pins is employed to detect the same number of detection points as the embodiment shown in FIG. 5, decreasing circuitry costs.

Figure 7:
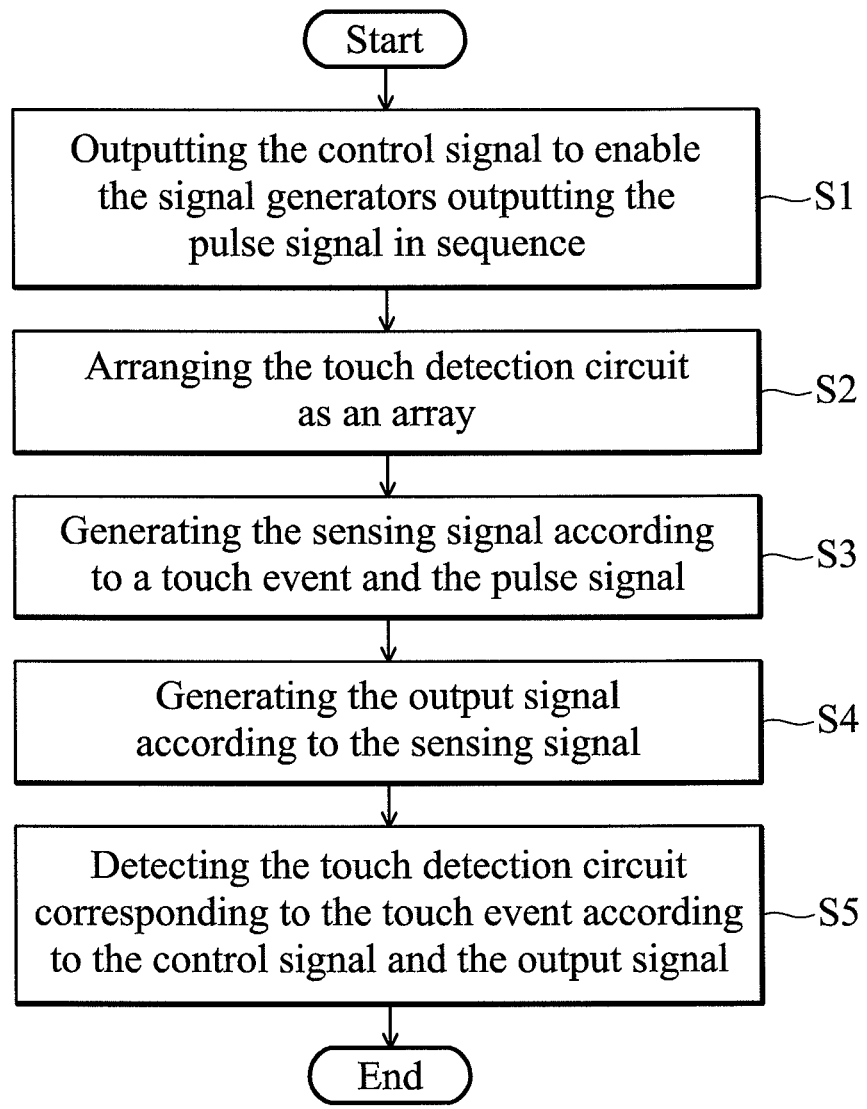
FIG. 7 is a flow chart showing the touch sensing method according to an embodiment of the invention.

FIG. 7 is a flow chart showing the touch sensing method according to an embodiment of the invention. The illustration of FIG. 7 is described with reference to the circuit diagram of FIG. 6. First, the controller 18 outputs the control signal CTRL to enable the signal generators 51-1~51-N respectively outputting a pulse signal, at different times, in a predetermined sequence (S1). Under the control of the controller 18, only one of the signal generators 51-1~51-N outputs the pulse signal at a time. That is to say, after a signal generator stops to output the pulse signal under the control of the controller 18, another signal generator starts to output the pulse signal. Next, the touch detection circuits 14-11~14-NK are arranged as the array shown in FIG. 6 (S2), and the touch detection circuits 14-11~14-NK respectively generate a sensing signal according to the touch event and the pulse signal P (S3). Next, the sensing signal generated by the touch detection circuits in the same column is detected to generate the output signal (S4). As shown in FIG. 6, the data lines F-1~F-K are respectively coupled to the touch detection circuits in the same column and output the output signals OUTPUT-1~OUTPUT-K. Finally, the controller 18 detects the touch detection circuit corresponding to the touch event according to the output control signal CTRL and the received output signals OUTPUT-1~OUTPUT-K (S5).

The touch sensing circuits and methods described in the embodiments simplify circuit designs and increases the number of the detection points for detecting a touch event by using the array arrangement. Implementing the touch sensing circuits and methods described in the embodiments of the invention to household products, such as microwave ovens, electromagnetic ovens, and refrigerators, will meet the trend for increased functionality of household products.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A touch sensing circuit, comprising:
a plurality of signal generators outputting a pulse signal according to a control signal;
a plurality of touch detection circuits arranged as an array, generating a sensing signal according to a touch event and the pulse signal, wherein the touch detection circuits on the same row are coupled to the same signal generator;
a plurality of sensing circuits respectively coupled to the touch detection circuits on the same column, generating an output signal according to the sensing signal; and
a controller receiving the output signal, outputting the control signal to enable one of the signal generators outputting the pulse signal, and detecting the touch detection circuit corresponding to the touch event according to the output control signal and the output signal;
wherein the signal generator comprises:
a pulse width modulator outputting a pulse width modulation signal;
a direct-current power source providing a direct-current voltage;
a first diode coupled between the touch detection circuit and the direct-current voltage, having a first anode and a first cathode;
a second diode having a second cathode coupled to the first anode, and a second anode coupled to the first cathode; and
a switching circuit coupled to the pulse width modulator and the direct-current power source, switching according to the pulse width modulation signal to output the pulse signal at a connection point of the first diode and the second diode.

2. The touch sensing circuit as claimed in claim 1, wherein the signal generator is a pulse width modulator outputting the pulse signal.

3. The touch sensing circuit as claimed in claim 1, wherein the switching circuit comprises:
a transistor having a control gate coupled to the pulse width modulator, a first electrode coupled to the direct-current power source, and a second electrode coupled to a reference power source; and
a first resistor-capacitor circuit comprising a first resistor and a first capacitor coupled between the control gate and the reference power source in parallel.

4. The touch sensing circuit as claimed in claim 1, wherein the switching circuit comprises:
a second capacitor coupled to the signal generator;
a third capacitor coupled to the second capacitor;
a third diode having a third anode coupled to the third capacitor, and a third cathode coupled to the sensing circuit;
a fourth diode having a fourth anode coupled to a reference power source, and a fourth cathode coupled to a connection point of the third diode and the third capacitor;
a second resistor coupled between the reference power source and a connection point of the second capacitor and the third capacitor; and
a touch sensing device coupled to the connection point of the second capacitor and the third capacitor, providing a capacitive loading effect according to the touch event.

5. The touch sensing circuit as claimed in claim 1, wherein the sensing circuit comprises:
a second resistor-capacitor circuit comprising a third resistor and a fourth capacitor coupled between the touch detection circuit and a reference power source in parallel; and
a sensing unit detecting a voltage level at a connection point of the third resistor and the fourth capacitor, outputting the output signal.

6. The touch sensing circuit as claimed in claim 1, wherein the controller comprises:
an analog to digital converter coupled to the sensing circuit, converting the output signal from an analog format to a digital format; and
a timing controller outputting the control signal to enable one of the signal generators outputting the pulse signal.

7. A touch sensing circuit, comprising:
a plurality of signal generators outputting a pulse signal according to a control signal;
a plurality of sensing circuits generating an output signal according to a sensing signal;
a plurality of first data lines extended along a first direction, and respectively coupled to a corresponding signal generator;
a plurality of second data lines extended along a second direction orthogonal to the first direction, respectively coupled to a corresponding sensing circuit;
a plurality of touch detection circuits respectively disposed on intersections of the first data lines and the second data lines, wherein one of the touch detection circuits receives the pulse signal and generates the sensing signal according to a touch event; and
a controller receiving the output signal, outputting the control signal to enable one of the signal generators outputting the pulse signal, and detecting the touch detection circuit corresponding to the touch event according to the output control signal and the output signal;
wherein the signal generator comprises:
a pulse width modulator outputting a pulse width modulation signal;
a direct-current power source providing a direct-current voltage;
a first diode coupled between the touch detection circuit and the direct-current voltage, having a first anode and a first cathode;
a second diode having a second cathode coupled to the first anode, and a second anode coupled to the first cathode; and
a switching circuit coupled to the pulse width modulator and the direct-current power source, switching according to the pulse width modulation signal to output the pulse signal at a connection point of the first diode and the second diode.

8. The touch sensing circuit as claimed in claim 7, wherein the touch detection circuits are arranged as an array, and the touch detection circuits on the same row are coupled to the same signal generator, and the touch detection circuits on the same column are coupled to the same sensing circuit.

9. The touch sensing circuit as claimed in claim 7, wherein the signal generator is a pulse width modulator outputting the pulse signal.

10. The touch sensing circuit as claimed in claim 7, wherein the switching circuit comprises:
a transistor having a control gate coupled to the pulse width modulator, a first electrode coupled to the direct-current power source, and a second electrode coupled to a reference power source; and a first resistor-capacitor circuit comprising a first resistor and a first capacitor coupled between the control gate and the reference power source in parallel.

11. The touch sensing circuit as claimed in claim 10, wherein the touch detection circuit comprises:
a second capacitor coupled to the signal generator;
a third capacitor coupled to the second capacitor;
a third diode having a third anode coupled to the third capacitor, and a third cathode coupled to the sensing circuit;
a fourth diode having a fourth anode coupled to a reference power source, and a fourth cathode coupled to a connection point of the third diode and the third capacitor;
a second resistor coupled between the reference power source and a connection point of the second capacitor and the third capacitor; and
a touch sensing device coupled to the connection point of the second capacitor and the third capacitor, providing a capacitive loading effect according to the touch event.

12. The touch sensing circuit as claimed in claim 7, wherein the sensing circuit comprises:
a second resistor-capacitor circuit comprising a third resistor and a fourth capacitor coupled between the touch detection circuit and a reference power source in parallel; and
a sensing unit detecting a voltage level at a connection point of the second resistor and the fourth capacitor, and outputting the output signal.

13. The touch sensing circuit as claimed in claim 7, wherein the controller comprises:
an analog to digital converter coupled to the sensing circuit and converting the output signal from an analog format to a digital format; and
a timing controller outputting the control signal to enable one of the signal generators outputting the pulse signal.

14. A touch sensing circuit, comprising:
a signal generator outputting a pulse signal according to a control signal;
a touch detection circuit generating a sensing signal according to a touch event and the pulse signal, comprising:
a first capacitor coupled to the signal generator;
a second capacitor coupled to the first capacitor;
a first diode having a first anode coupled to the second capacitor, and a first cathode outputting the sensing signal;
a second diode having a second anode coupled to a reference power source, and a second cathode coupled to a connection point of the first diode and the second capacitor;
a first resistor coupled between the reference power source and a connection point of the first capacitor and the second capacitor; and
a touch sensing device coupled to the connection point of the first capacitor and the second capacitor, and providing a capacitive loading effect according to the touch event;
a sensing circuit coupled to the touch detection circuit, and generating an output signal according to the sensing signal; and
a controller outputting the control signal and detecting the touch event according to the output signal.

15. The touch sensing circuit as claimed in claim 14, wherein the signal generator is a pulse width modulator outputting the pulse signal.

16. The touch sensing circuit as claimed in claim 14, wherein the signal generator comprises:
a pulse width modulator outputting a pulse width modulation signal;
a direct-current power source providing a direct-current voltage;
a third diode coupled between the touch detection circuit and the direct-current voltage, and having a third anode and a third cathode;
a fourth diode having a fourth cathode coupled to the third anode, and a fourth anode coupled to the third cathode; and
a switching circuit coupled to the pulse width modulator and the direct-current power source, and switching according to the pulse width modulation signal to output the pulse signal at a connection point of the third diode and the fourth diode, wherein the switching circuit comprises:
a transistor having a control gate coupled to the pulse width modulator, a first electrode coupled to the direct-current power source, and a second electrode coupled to a reference power source; and
a first resistor-capacitor circuit comprising a second resistor and a third capacitor coupled between the control gate and the reference power source in parallel.

17. The touch sensing circuit as claimed in claim 14, wherein the sensing circuit comprises:
a second resistor-capacitor circuit comprising a third resistor and a fourth capacitor coupled between the touch detection circuit and the reference power source in parallel; and
a sensing unit detecting a voltage level at a connection point of the second resistor and the fourth capacitor, and outputting the output signal.

18. The touch sensing circuit as claimed in claim 14, wherein the controller comprises:
an analog to digital converter coupled to the sensing circuit and converting the output signal from an analog format to a digital format; and
a timing controller outputting the control signal.

* * * * *